United States Patent [19]

Chrysler et al.

[11] Patent Number: 4,928,207
[45] Date of Patent: May 22, 1990

[54] CIRCUIT MODULE WITH DIRECT LIQUID COOLING BY A COOLANT FLOWING BETWEEN A HEAT PRODUCING COMPONENT AND THE FACE OF A PISTON

[75] Inventors: Gregory Chrysler; Richard C. Chu; Robert E. Simons, all of Poughkeepsie, N.Y.

[73] Assignee: International Business Machines Corporation, Armonk, N.Y.

[21] Appl. No.: 366,945

[22] Filed: Jun. 15, 1989

[51] Int. Cl.⁵ .............................................. H05K 7/20
[52] U.S. Cl. .................................................... 361/385
[58] Field of Search ......................... 361/385, 382, 384

[56] References Cited

U.S. PATENT DOCUMENTS

| | | | |
|---|---|---|---|
| 3,993,123 | 11/1986 | Chu et al. | 165/80 |
| 4,561,040 | 12/1985 | Eastman et al. | 361/385 |
| 4,639,829 | 1/1987 | Ostergren et al. | 361/385 |
| 4,729,060 | 3/1988 | Yamamoto et al. | 361/385 |
| 4,765,397 | 8/1988 | Chrysler et al. | 165/104.33 |
| 4,833,567 | 5/1989 | Saaski et al. | 361/385 |

OTHER PUBLICATIONS

IBM Technical Disclosure Bulletin, vol. 27, No. 12, May 1985, vol. 27, No. 12, May 1985 "Thermal... Onto The Chip" by R. C. Chu.
IBM Technical Disclosure Bulletin, vol. 29, No. 7, Dec. 1986, "Liquid Cooled Circuit Package with Jet Impinging on Heat... From the Jet" by W. M. Antonetti et al.
IBM Technical Disclosure Bulletin, vol. 29, No. 11, Apr. 1987, "Thermal Conduction Module With Dielectric... Transfer" by R. C. Chu.

Primary Examiner—Roy N. Envall, Jr.
Attorney, Agent, or Firm—Richard M. Ludwin

[57] ABSTRACT

In an improved circuit module with a flat chip-carrying substrate and cylindrical pistons that contact the chips for cooling, each piston has an axial bore that carries a dielectric liquid to the chip and the lower face of the piston (facing the chip) is spaced away from the chip to establish radial channels that carry the liquid across the surface of the chip. The face of the piston, as seen in a section through the axis, is shaped to provide a selected flow pattern across the surface of the chip. The piston face reduces the channel height in the direction of flow where the liquid is non-boiling and thereby offsets the tendency for the flow rate to decrease as the circumferential width of the channel widens. The piston face increases the channel height in the direction of flow where the liquid is boiling to handle the increase in volume caused by the vapor. In one embodiment, the piston carries a shroud around the chip which causes the coolant to flow across the edge of the chip to provide additional chip cooling and to impinge on the nearby region of the substrate that supports the chips to remove heat that flows from the chip to the substrate.

11 Claims, 6 Drawing Sheets

CIRCUIT MODULE WITH DIRECT LIQUID COOLING BY A COOLANT FLOWING BETWEEN A HEAT PRODUCING COMPONENT AND THE FACE OF A PISTON

INTRODUCTION

This invention relates to circuit modules with apparatus for cooling high power components such as semiconductor chips and more specifically to a module with convection cooling by a dielectric liquid carried by elements, commonly called pistons, that contact the outer surface of a chip and are carried by a supporting structure.

BACKGROUND OF THE INVENTION

Some circuit modules have a thin, flat substrate with semiconductor chips that are attached to metal pads at an array of chip sites on the upper surface of the substrate. The orientation of the substrate with the chip surface facing up is arbitrary to simplify the terminology.

The substrate has pins that extend from its lower surface and plug into connectors of a supporting circuit board. Layers of wiring inside the substrate interconnect the pads and the pins. Some modules have a structure called a hat that forms part of an enclosure for the chips and also forms part of the module cooling apparatus. The lower surface of the hat has cylindrical holes opening to face the chip sites and the holes carry cylindrical elements called pistons that each contact the upper surface of a chip. Conventionally, the pistons are made of a thermal conductor and transfer heat from the chips to the hat by conduction, and the module is commonly called a thermal conduction module or TCM. The hat is conventionally cooled by chilled water.

Many improvements in chip performance require the chip to dissipate more power, and it is a general object in this art to provide a TCM-like device with improved heat transfer. It is also an object in this art to operate the chips at a low temperature, for example at the temperature of liquid nitrogen.

SUMMARY OF THE INVENTION

In our module, a piston has a central bore that is open at the top to receive a dielectric liquid coolant and is open at the lower face of the piston to supply the coolant to the upper surface of the chip. The lower face of the piston is spaced away from the chip to thereby establish a channel for the coolant to flow across the chip. As seen from the top of the module, the flow is substantially radially symmetrical. At any radial distance from the axis of the piston, the channel has a cross section with a circumferential width and with a height that equals the height of piston face above the surface of the chip. The flow rate of the coolant at a given point is established in part by this area, and the face of the piston is shaped to provide a flow rate that is appropriate for cooling the chip.

The term "dielectric" means that the coolant is electrically non-conducting and can be brought into direct contact with heat producing chips that have exposed voltage carrying electrodes. These liquids are also chemically inert. A non-dielectric liquid, water for example, usually must be separated from the components to prevent corrosion and to prevent electrically short circuiting the components. Water also slows the propagation of electrical signals in nearby conductors.

Dielectric liquids are commercially available that boil at various temperatures, and a dielectric liquid can be chosen to be boiling or non-boiling at the normal operation temperature of the module. For a given liquid, a selected boiling temperature can be achieved within a limited range by controlling the pressure in the chip space. Fluorocarbons have been used in commercially available circuit modules, both in a boiling mode and a non-boiling mode. Liquid nitrogen has a low boiling temperature and can be used in either a boiling mode or non-boiling mode.

Our module can be used with a coolant that remains liquid or with a coolant that boils as it flows across the chip. For a boiling coolant, the piston face is shaped according to the desired flow rate and the increase in coolant volume that occurs as the coolant boils.

The liquid leaves the bore of the piston as a liquid. As the coolant picks up heat from the chip, its temperature rises, and in some embodiments of our invention the coolant begins to boil. For a particular chip, boiling begins at a radial distance from the bore that depends on the power the chip dissipates. Preferably the pistons are identical and each piston face is shaped to handle a chip operating at maximum power. For chips operating at lower power, boiling may not occur or it may occur at a greater radius but these chips will be adequately cooled. (Several ways to maintain a uniform temperature among chips of different power will be described.)

The radial distance at which boiling occurs also depends on the properties of the coolant that is chosen for the module and on the pressure maintained inside the module. Our module will be useful with a wide range of coolants and operating pressures.

As seen in a section through the axis of the piston, the face curves downward and outward from the edge of the bore to a predetermined point and then curves upward. Where boiling does not occur, the density of the coolant is substantially constant and the downward curve to the piston face offsets the increase in the circumferential width of the gap and maintains a flow rate that is approximately uniform or increases to offset an increase in coolant temperature. In the region where boiling occurs, the piston face is curved downward or upward, depending on the accumulated amount of boiling and on the radial position.

Preferably, the piston is made of a material which is electrically non-conducting, plastic for example. These materials are poor thermal conductors. Conventionally, pistons are made of metal to provide good thermal conductivity. Metals are good electrical conductors, and electrical insulation is commonly established between the chip and the hat, for example by anodizing the pistons.

In one embodiment, the pistons are made of metal and the face of the piston carries thin radial fins that space the piston face away from the chip. These fins establish coolant channels that are pie-shaped as seen from the top. The fins also provide a useful amount of heat conduction from the chip to the body of the piston. In one embodiment, the pistons carry annular horizontally extending fins which are cooled by the liquid flowing through the bore. These fins condense some or all of the vapor inside the chip space. The appropriate temperature for the coolant at the exit of the bore is established by the chip cooling requirements, and the coolant entering the piston bore is made suitably colder to cool the fins.

In another embodiment, part of the piston is made of metal for heat transfer to the coolant in the bore from the chip and/or from the annular fins, and part of the piston is made of plastic for electrical insulation.

In yet another embodiment, the piston carries a shroud that extends over the edge of the chip and cools the chip by heat transfer though the edge of the chip and through the nearby area of the substrate.

THE PRIOR ART AND RELATED PUBLICATIONS

These references describe other attempts to cool chips by a liquid dielectric and some of the other techniques of heat transfer that are used in our module. The *IBM Technical Disclosure Bulletin* is cited as TDB.

Heat transfer in a TCM can be improved by filling the chip space with a dielectric liquid, as set out in Chu et al. U.S. pat. No. 3,993,123. The dielectric liquid helps to carry heat through the chip space and across small gaps between a chip and its piston and between a piston and the hat. The prior art has also proposed circulating the dielectric liquid through the chip space and through an external heat exchanger.

When the coolant boils, the vapor increases the coolant volume significantly and there is a problem of exhausting the vapor from the module. In a forthcoming publication two of us (Chu and Simons) describe a module with a condenser inside the module to condense some of the vapor inside the chip space. In another forthcoming publication we describe a module in which this problem is reduced by mixing the vapor with the liquid to recondense it in the chip space. Turbulators enhance the mixing and they remain at the average temperature of the coolant and condense some of the vapor.

December 1986 TDB page 2887 shows a module in which a jet of liquid dielectric is directed against a heat sink that forms part of a barrier separating the chip space from a coolant space. The jet provides improved cooling by a mechanism called "jet impingement".

April 1987 TDB 5117 shows a piston with fins that help to transfer heat from the piston to a liquid dielectric in parallel with the conventional heat transfer path from the piston to the hat. May 1985 TDB 6904 also relates to transferring heat from the piston to the coolant: the pistons have a surface that promotes nucleate boiling.

May 1985 TDB 6898 shows a piston with a central bore that extends from the top of the piston to a point near the lower end of the piston where it divides into four branches that open at symmetrically located points of equal radius on the face of the piston. The top of the piston is arranged to receive the incoming liquid. The piston is domed so that the center of the piston face touches the chip and the openings are spaced away from the chip so that the liquid can flow onto the chip and across the surface of the chip.

Our U.S. pat. No. 4,765,397 describes a heat transfer device in which a coolant channel is given a constricted shape to increase the flow rate of the coolant to compensate for the increase in temperature.

THE MODULE OF THE DRAWINGS

Figure 1:
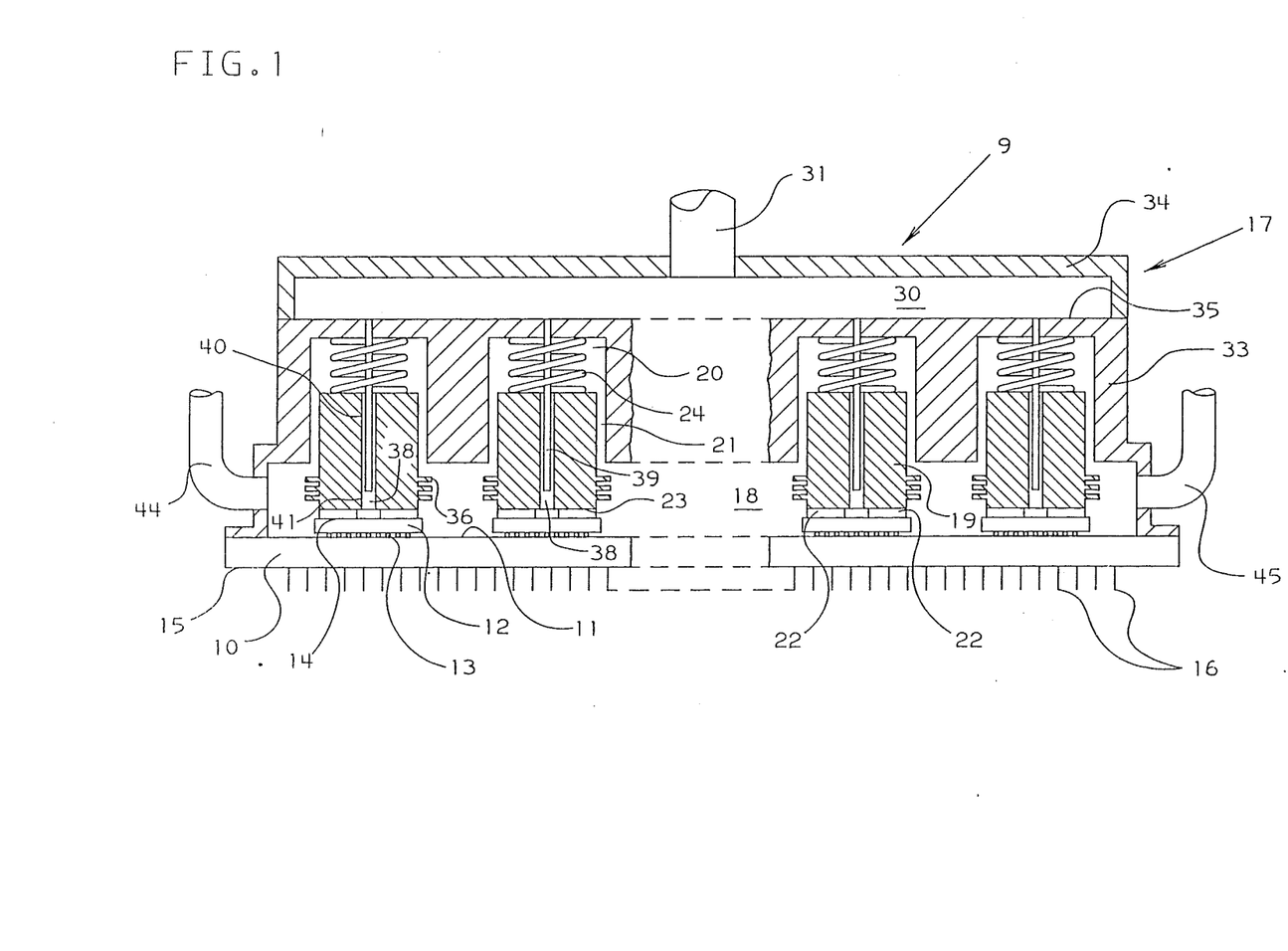
FIG. 1 is a section view of a module using the piston and associated structure of a first embodiment of this invention.

Introduction—Conventional Features In FIG. 1

FIG. 1 shows a module 9 that is oriented with a substrate 10 in a horizontal plane with its chip carrying surface 11 facing up. This orientation emphasizes the symmetry of the row and column arrangement of the chips on the substrate and components of the module that are aligned with the chips. Gas filled modules are conventionally oriented with the substrate in a vertical plane, and this orientation will be used later in the description of FIG. 2. The orientation of FIG. 1 is valid for describing the coolant flow across the surface of the module because the flow is substantially radially symmetrical, independently of the actual orientation of the module, and the preferred piston is in fact radially symmetrical.

Chips 12 are electrically and mechanically connected to pads (not shown) by solder balls 13. From a more general standpoint, the chip is a heat producing component and the upper chip surface 14 is a heat transfer surface of the chip or an associated packaging structure, such as a can that encloses the chip. The substrate lower surface 15 carries pins 16 that plug into a circuit board. Wiring inside the substrate brings power to the chips and makes signal connections from one chip to another and between the chips and the pins. A structure 17, called the hat, cooperates with the substrate to form an enclosed space 18 for the chips, as is conventional in the hat of a TCM. The hat supports structures 19 called pistons in an array of holes 20 each overlying an associated chip site. In the embodiment of FIG. 1, the holes 20 are cylindrical and the pistons 19 have enough clearance space 21 to permit the pistons to move vertically. (Space 21 is greatly exaggerated in the drawing.)

The Hat And Piston Structure—FIG. 1

The pistons of FIG. 1 have spacers 22 that position the lower piston face 23 a predetermined distance above the chip surface 14. The spacers are thin radial fins that contact the chip surface 14 along their lower edges. Other spacers will be described later. A spring 24 is located in the hole 20 to urge the piston downward toward the chip site. The spring structure and the clearance space 21 are similar to a conventional TCM and allow the pistons to adapt to the variations in the height and tilt of the chips with respect to a reference plane.

From a more general standpoint, the module is designed and/or manufactured for each piston face 23 to be located at a predetermined position above the corresponding chip surface 14. The chips can be specified to have a particular height above a reference plane, and in this case the hat and piston structure can be manufactured with the piston faces 23 located at a fixed reference position in the hat. Alternatively, the pistons can be made adjustable in the hat and then set during manufacturing to a fixed position with respect to the chips. In these modifications of the module of FIG. 1, the spacers 22 are not needed.

The hat 17 is adapted to form a coolant plenum chamber 30 that overlies the chip sites, and the hat has an inlet fitting 31 for admitting a liquid coolant into the chamber. These structures are analogous to the chilled water structure of a TCM with an integrated cold plate and can be implemented in various known ways. They are shown somewhat schematically in the drawing. The hat has a part 33 that forms part of the enclosure for the chip space 18 and supports the pistons. The piston 19 cooperates with part 33 to form the coolant chamber. The upper surface 35 of the piston supporting part 33 forms the floor of chamber 30.

In the embodiment of FIG. 1, the piston has an axial bore 38 that extends completely through the piston. At the upper end of the piston, the bore is adapted to communicate with the coolant chamber 30, and the lower part of the piston is adapted to deliver a jet of the coolant onto surface 14 of the chip. In the embodiment of FIG. 1, a tube 39 extends from chamber 30 to a point just above the face of the piston, dividing the bore and the piston into an upper part 40 where the tube separates the piston from direct contact with the coolant and a lower part 41 where the coolant directly contacts the wall of bore 38.

The hat has two outlet fittings 44, 45 that carry the coolant from the chip space, as described later.

The Coolant Path Through The Piston

In the embodiment of FIG. 1, the piston is a unitary structure of metal, which is advantageously a good thermal conductor and undesirably a good electrical conductor. (In some modules, the chips must be electrically isolated from the hat.) Contact between the coolant and the wall of the bore cools the piston, and this cooling effect can be used in several ways. The spacers 22 are in the thermal conduction path between the chip and the cold part 40 of the piston bore and thereby cool the chip by conduction. Since the spacers are made thin to provide a large area for coolant flow, the area of contact between the spacers and the chip is small and the thermal resistance is high at this interface. However, conduction in this path is enhanced by the fact that the coolant is brought close to the spacers and the conduction path is quite short. As will be explained later, the liquid in chamber 30 is given a suitable temperature to compensate for heat transfer to the liquid in bore part 41 (the liquid does not boil in the bore).

In a module in which the coolant boils, the low temperature of the piston can also be used for condensing some of the vapor in the chip space. The pistons of FIG. 1 have several annular fins 36 that are in thermal conduction with the coolant in bore part 41.

Figure 3:
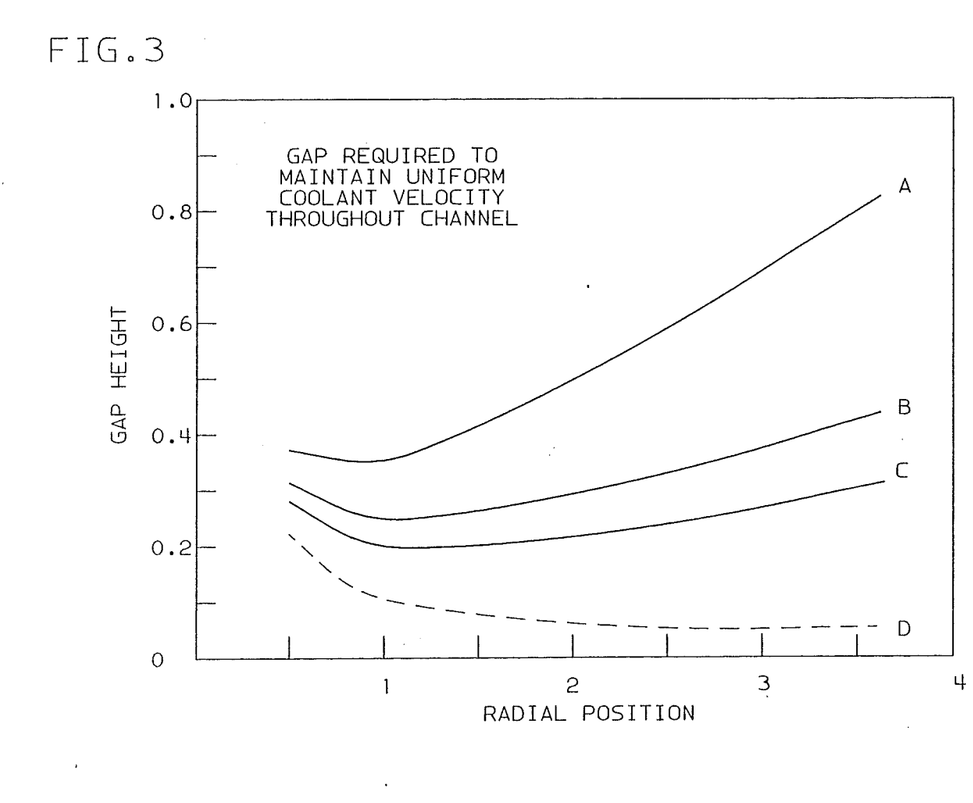
FIG. 3 is a graph showing the shape of the piston face for several different flow rates of a coolant.

The Shape Of The Piston Face—FIG. 3

In FIG. 1, the coolant flows down bore 38 with a predetermined velocity that depends on the rate at which the coolant is supplied to the chip and the diameter of the bore, and a jet of coolant impinges on the chip surface 14. In the model represented in FIG. 3, the coolant flow rate is constant, the bore diameter is constant, and accordingly the jet velocity is constant. The force of the jet carries the liquid and any accompanying vapor outward through the gap between the chip surface 14 and the piston face 23 in a pattern that is substantially radially symmetrical about the axis of the bore, and the piston face is also radially symmetrical. (A non-radial coolant flow will be illustrated later.)

The velocity of the coolant across the chip surface 14 significantly affects the chip cooling. At a particular point on a radial line, this velocity is in part a function of the cross sectional area of the gap at the point. One dimension of this cross sectional area is the gap height, which can be seen in FIG. 1, and the other dimension is the circumference of a circle at the point, as would be seen looking along the axis of a piston.

In FIG. 3, the horizontal axis (abscissa) represents a position on the chip surface 14 measured radially from the axis of the piston. The vertical axis (ordinate) represents the gap between the chip surface 14 and the piston face 23. Since the surface of the chip is flat, the curves directly represent the shape of the piston face except that the vertical scale is larger than the horizontal scale and the curve of the piston face is exaggerated.

The four curves, A-D, each show the gap height to maintain a uniform flow rate across chip surface 14 under particular cooling conditions. (The flow rate is different for each curve because the cross sectional areas are different at corresponding points.) All cases represent the same coolant and the same chip size but decreasing chip power in the sequence A TO D.

Uniform flow rate is a reference condition. Ordinarily it will be desirable to increase the flow rate as a function of radius: cooling is a function of the flow rate and the coolant temperature, and an increase in velocity can offset the temperature increase that occurs as the coolant picks up heat from a chip. Other flow rates, including a decreasing flow rate, can be understood from the curves, as will be explained later.

Plots A-C represent a boiling coolant at three different flow rates, and curve D represents a non-boiling coolant. Note that leftmost radial position of the curves is approximately the radius of the piston bore.

In case D (the coolant does not boil) the coolant density does not change significantly and its velocity at a particular point on the chip surface varies only with the cross sectional area of the gap at that point. Therefore, curve D is a linear function of the reciprocal of the radial distance from the piston axis providing constant cross sectional flow area and constant coolant velocity. The gap decreases continuously with radius.

If the piston face for curve D is modified to decrease the cross sectional area as a function of radius, the curve for the non-boiling case lies below curve D. Conversely, if the piston face for curve D is modified to increase the cross sectional area as a function of radius, the curve lies above curve D.

Curves A, B and C represent boiling liquids under three different cooling conditions. As the coolant boils, vapor bubbles are formed and the volume of a particular mass of coolant expands. The piston face is shaped to accommodate this expansion.

For curves A-C, the gap height decreases to the point where boiling begins and thereafter it increases to accommodate the increasing volume of vapor. (Contrast curve D which decreases continuously). Since the chip represented in FIG. 3 is heated uniformly, vapor bubbles are formed at a constant rate as a function of radius. Thus, vapor bubbles accumulate in the radially outward (downstream) direction. Only part of the liquid boils, ordinarily less than about 10%.

Now consider curve D from a different standpoint. If at some point the curve becomes flat, the cross sectional area would increase with radius. Similarly, the cross sectional area would increase if the curve were decreased at a lower rate than the inverse of the radius function illustrated by curve D. Thus, from a geometric standpoint the increase in coolant volume might be accommodated by a flat curve or a curve that slopes shallowly downward. However, the increase in volume caused by boiling will ordinarily be so great that a point can be defined where boiling occurs and the piston face will curve downward to that point and then curve upward.

Note that the downward slopes of curves A-C are less than the corresponding part of curve D and more specifically that the slopes decrease in the sequence C-A (i.e. as the gap is greater at corresponding points). This is a purely geometric effect.

Sealing Chip Space 18 From Coolant Chamber 30

The space 21 between the piston and the wall of the piston hole 20 may allow some coolant to bypass the jet that strikes chip surface 14. So long as the desired jet is maintained at the face of the piston, the coolant flow through space 21 will not adversely affect the cooling capability of the module (it may require a larger pump).

In the embodiment of FIG. 1, tube 39 creates a labyrinth between chamber 30 and the space 21 and thereby prevents a significant amount of coolant from flowing through space 21. In an alternative embodiment, tube 39 is not used and the bore part 41 extends for the full length of the piston. The opening in hat part 33 that otherwise receives tube 39 can be any suitable diameter. In this embodiment, the piston hole 20 extends from the chip space 18 to the coolant chamber 30 and thereby presents a more direct path for coolant to bypass the bore of the piston. The clearance space 21 between the piston and the wall of the hole is conventionally very small, and the amount of coolant flowing between the piston and the wall of the hole may be negligible in many cases.

In one alternative piston sealing arrangement, a sealing ring is located between the piston and the wall of the hole. For modules that are cooled with a fluorocarbon, the ring is preferably made of a material such as polytetrafluoroethylene (PTFE) that swells when in contact with a fluorocarbon and thereby forms a tighter seal.

The prior art has proposed various mechanisms for separating the chip space from a coolant, for example flexible barriers and flexible bellows, and these devices can be used for sealing the piston. If the piston is formed as a rigid part of the hat, a separate seal for the pistons is not required.

Conventional modules have a standard pattern of chip sites and a corresponding pattern of holes for pistons. In some conventional modules, some chip sites do not carry chips, and the corresponding holes do not carry pistons. For chip sites that are not used in our module, the cylindrical hole is suitably plugged to prevent the unused hole from bypassing the coolant. For example, the hole can be plugged with a plastic piston or with an equivalent tight fitting structure that does not have a central bore. If the piston is sealed with a bellows or flexible barrier, other suitable plugging structures will be readily apparent.

Figure 2:
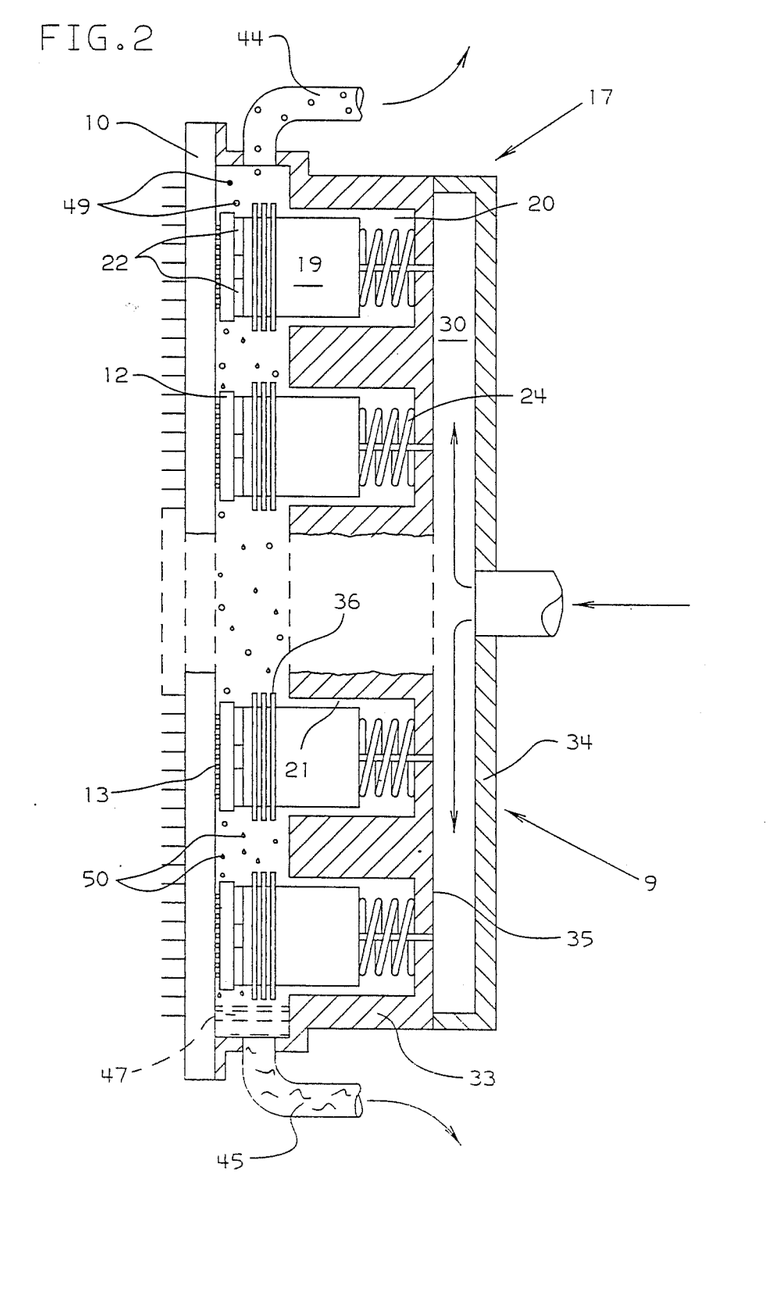
FIG. 2 is a section view of the module of FIG. 1 showing the flow of the coolant through the module.

Coolant And Vapor Flow Inside The Module—FIG. 2

FIG. 2 shows the module 9 in its normal orientation with the substrate in a vertical plane. In a module in which the coolant boils, vapor 49 diffuses upward toward outlet fitting 44. The module 9 can be initially filled with either liquid or vapor. In a module filled with liquid, the vapor from the boiling coolant is in the form of bubbles 49. In any event, the liquid (or liquid droplets 50 in the vapor filled embodiment), falls to the bottom of the chip space which forms a sump 47 that communicates with outlet fitting 45.

The vapor is difficult to handle outside the module because its volume is much greater than the volume of the corresponding mass of liquid. Preferably, means is provided for condensing some or all of the vapor within the chip space, and FIG. 2 shows the fins 36 of FIG. 1. Alternatively or additionally, a separate heat exchanger of any suitable design can be located inside the module or in sufficiently intimate association with the module that the condensed coolant can flow to sump 47 as in FIG. 2.

Although the pistons toward the top of the module receive more vapor than the pistons at the bottom of the module, in most applications of the module of FIG. 1, the differences will be small and each piston will be given the same fin arrangement. Alternatively, each piston can be adapted to its vapor condensing load. For example, the fin arrangement can be varied or the length of the cold part 41 of the piston can be varied.

Figure 4:
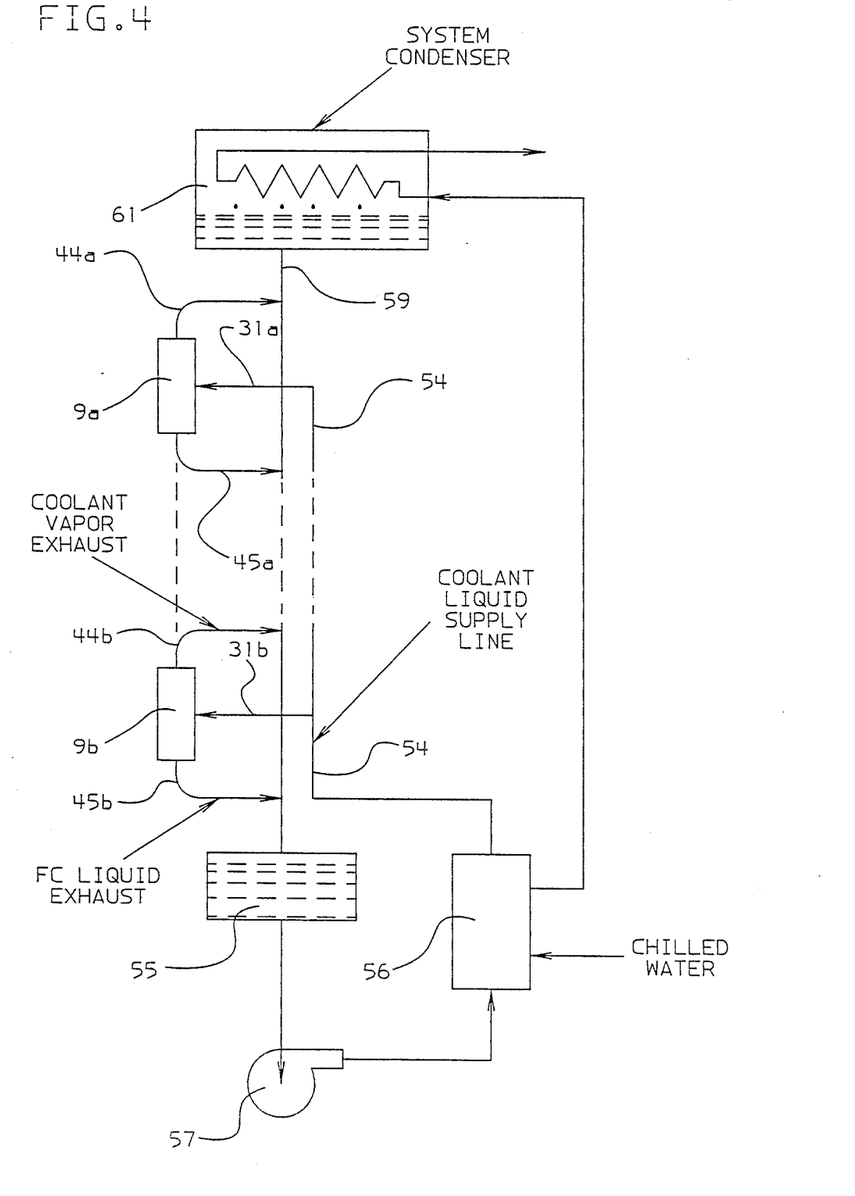
FIG. 4 is a diagram of the coolant flow outside the module for a data processing system having several modules.

The External Coolant Circuit—FIG. 4

FIG. 4 shows the external piping for a system of modules that operate at about room temperature. Two representative modules 9a, 9b have their coolant inlet fittings 31a, 31b connected to a common supply line 54. Supply line 54 is connected in circuit with an expansion tank 55, a pump 57 and a cooler 56. Cooler 56 is preferably a heat exchanger that is supplied with chilled water. The coolant liquid outlet fittings 45a, 45b and the vapor outlet fittings 44a, 44b of the modules are connected to a common line 59 that runs vertically so that vapor from outlet fittings 44a, 44b diffuses upward and liquid from outlet fittings 45a, 45b flows downward. The expansion tank 55 receives the liquid and supplies it to pump 57. A heat exchanger 61 receives the vapor and condenses it. The condensate in the vapor condensing heat exchanger 61 flows down line 59 to sump expansion tank 55. The heat exchanger 61 for the vapor operates from the chilled water supply and may be connected down stream of the heat exchanger 58 for the liquid coolant.

FIG. 4 illustrates the general connection of the module in a coolant circuit. Techniques for handling liquids and vapors at room temperature are well known in other arts. Similarly, techniques for handling liquid nitrogen are well known and will be apparent from FIG. 4.

The Piston Structure

Because the liquid coolant has a high capacity for carrying away thermal energy from the chips, it is possible to give up the thermal conduction path provided by the metal piston of FIG. 1 and to make the piston entirely or partly of a material such as plastic that is thermally non-conductive. Plastic pistons meet the insulation requirement that has been described earlier in this specification. In addition, plastic pistons have a lower mass than the corresponding metal pistons, and thereby transmit less vibration to the chips than metal pistons. Many plastics are compatible with various dielectric liquids and are usable at various temperatures. A plastic piston is preferably manufactured by molding. Conventional plastics do not conduct heat well enough to make the annular fins 36 useful. A separate heat exchanger for condensing the vapor is located inside chip space 18 or outside the chip space or both. Similarly, the area of contact between the piston and the chip is not significant from the standpoint of heat transfer by conduction, and the spacers can be in the form of bumps or other shapes without regard to the area of contact.

The metal piston of FIG. 1 is preferably shaped by a machining operation. Suitable materials are known from the art of conventional TCM's.

In another embodiment the piston is made of a combination of plastic and metal. The center part of the piston is made of metal to provide thermal conduction from the annular rings to the liquid in bore 38. Either the lower part of the piston or the upper part of the piston (or both) are made of plastic to provide electrical insulation (and lower mass).

If only the upper part of the piston is plastic, the upper part extends downward far enough, considering the variations in the height of the chip, to prevent electrical contact between the hat and the metal part of the piston. The piston bore 38 and the optional tube 39 are arranged to bring the coolant into contact with the wall of the bore of the metal part of the piston. The metal and plastic parts can be joined by any suitable technique for joining these materials. Preferably the plastic and metal parts of the piston inter-fit, for example by a threaded coupling.

If the lower part of the piston is made of metal, the spacers are optionally constructed to provide heat transfer from the chip by conduction, as explained in the description of FIG. 1.

The Piston Spacer

Figure 5:
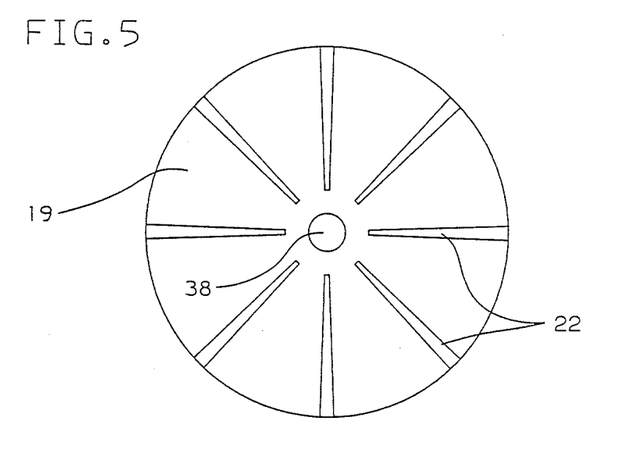
FIG. 5 is a drawing of the piston face showing the shape of the spacers.
Figure 6:
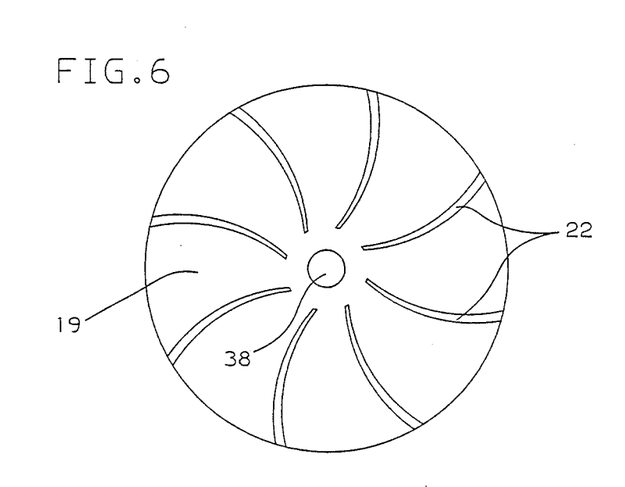
FIG. 6 is a drawing of the piston face showing an alternative spacer design.

In the embodiment of FIG. 1, spacers 22 are in the form of fins that form vanes that direct the flow of the coolant across the face of the chip. The fins can be flat and thereby, as seen from the top, in FIG. 5 form pie-shaped channels. Alternatively, the vanes can be curved to produce a non-radial flow pattern as is shown in FIG. 6. At the molecular level the coolant flows in spirals and thereby enhances the heat transfer.

Ordinarily these vanes 22 will be made as thin as possible to enhance heat transfer by convection, even though this spacer shape reduces heat transfer by conduction. However, from a different point of view, the channels are slots formed in the lower end of the piston. The terminology "fins" emphasizes that cooling is primarily by convection and only secondarily, or not at all, by conduction.

Adjusting The Thermal Resistance

Chips must be operated within predetermined temperature limits. This requirement creates a problem of providing enough cooling for high power chips without overcooling the low power chips. Several techniques have been used and proposed for achieving uniform chip temperatures in conventional TCM's. The supply of the liquid coolant to the chips can be adjusted by adjusting the diameter of the bore 38 or the diameter of tube 39 or the height of the gap for example. In embodiments that use conduction cooling, the resistance of the conduction path can be adjusted in various ways that will be apparent by analogy to a conventional TCM.

Figure 7:
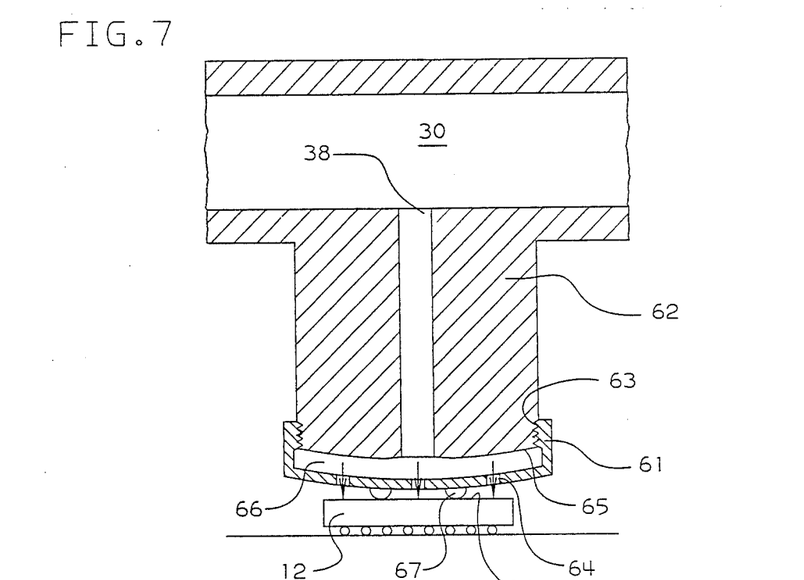
FIG. 7 is a section view of an alternative piston.

In the embodiment of FIG. 7, the face of the piston is formed by a separate part 61 that is attached to the body 62 of the piston by means such as threads 63. Face part is made in several forms that deliver the coolant to the chip at different rates and/or in different patterns. In the embodiment of FIG. 7, the bore of the piston branches to several openings 64 in the piston face 65 and the face part has a thin structure that forms a plenum chamber 66 for distributing the coolant from the bore to the openings 64. Preferably, the face of the piston carries bumps 67 that space the piston face away from the chip surface 14.

Figure 8:
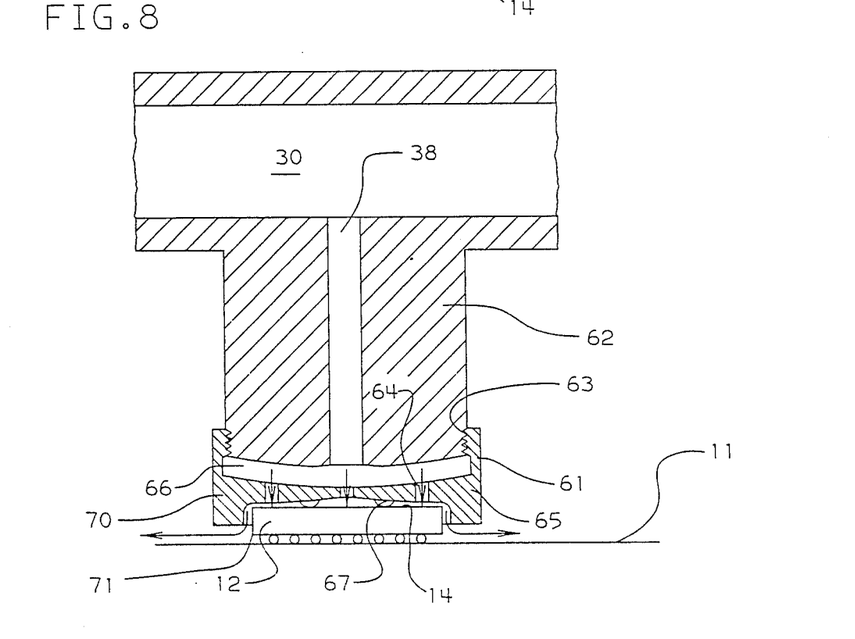
FIG. 8 is a section view of the piston of FIG. 7 with a shroud that directs the flow of the coolant around the edge of the chip.

The Piston And Shroud—FIG. 8

FIG. 8 shows a piston that carries a shroud 70 that causes the coolant to flow around the edge 71 of the chip 12. The area of chip edge 71 is smaller than the surface 14 where substantially all heat transfer occurs in the modules of the other figures but the area is large enough for a useful amount of heat transfer. In our module and in a conventional TCM, some heat from the chip flows through the solder balls and into the circuit board. The shroud is shaped to cause the coolant to impinge on the nearby surface 11 of the substrate. The coolant that impinges on surface 11 provides a useful amount of additional heat transfer.

In the piston structure of FIG. 8, the shroud is square as seen from the top and the space between the chip edge 71 and the nearby wall of the shroud are separated uniformly by the gap shown in the drawing. Alternatively, the shroud can be cylindrical to preserve the radial symmetry of the piston.

FIG. 8 is similar to FIG. 7 and similar reference characters are used for otherwise identical parts of the module. In the module of FIG. 7, the coolant flows across the edge of the chip and across the substrate, but the cooling is more effective in FIG. 8 because the shroud confines the coolant flow more closely to the heat transfer surfaces of the chip and the substrate.

Other Embodiments

The piston and the hat comprise several components, some which are optional and some which have been shown in different forms in different drawings or described in different forms in the specification but not shown in the drawings. It will be readily apparent where these forms can be used in combinations that are not explicitly recited. Also, those skilled in the art of cooling of circuit modules or the general heat transfer arts will recognize modifications of these specific examples within the spirit of the invention and the intended scope of the claims.

Having thus described our invention, what we claim as new and desire to secure by Letters Patent is:

1. A circuit module, comprising:
   a substrate having a chip carrying surface;
   an array of chips located at chip sites on the chip carrying surface of the substrate;
   a hat cooperating with the substrate to form an enclosed space for the chips, the hat comprising supply means for supplying a liquid coolant;
   pistons located in the hat above the chip sites, each of the pistons having a bore, therethrough, connected to carry a liquid coolant from the supply means to one of the chips, and each of the pistons further having a lower face, the lower face having a radially symmetrical shape; and spacer means located on the lower face, for contacting an upper surface of the one of the chips and for forming a gap between the lower face and the upper surface.

2. The circuit module of claim 1, wherein the lower face is shaped such that the gap between the lower face and the upper surface increases as a function of radial distance from the bore.

3. The circuit module of claim 1, wherein the lower face is shaped such that the gap between the lower face and the upper surface decreases as a function of radial distance from the bore.

4. The circuit module of claim 1, wherein the lower face is shaped such that a first portion of the gap between the lower face and the upper surface decreases as a function of radial distance from the bore and a second portion of the gap between the lower face and the upper surface increases as a function of radial distance from the bore.

5. The circuit module of claim 1, wherein the upper surface comprises an area within which coolant boiling begins, the area having a predetermined radius and wherein the lower face slopes downward inside the radius and slopes upward outside the radius.

6. The circuit module of claim 1 wherein the spacer means comprises bumps on the lower face.

7. The circuit module of claim 1 wherein the spacer means comprises radial fins disposed to form pie shaped channels on the upper surface.

8. The circuit module of claim 1 wherein the spacer means comprises vane fins disposed to form non-radial channels on the upper surface.

9. The circuit module of claim 1 wherein the pistons further comprise a shroud, the shroud being disposed around the one of the chips and forming a coolant flow path across an edge of the one of the chips and radially across the substrate.

10. A circuit module, comprising:
a substrate having a chip carrying surface;
an array of chips located at chip sites on the chip carrying surface of the substate;
a hat cooperating with the substrate to form an enclosed space for the chips, said hat comprising supply means for supplying a liquid coolant;
pistons located in the hat above the chip sites, each of the pistons having a bore, therethrough, connected to carry a liquid coolant from the supply means to one of the chips, and each of the pistons further having lower face, the lower face having a radially symmetrical shape; and
a spacer comprising a plurality annularly disposed fins, the spacer being disposed on the lower face so that said fins contact an upper surface of the one of the chips and form a plurality of channels thereon.

11. A circuit module, comprising:
a substrate having a chip carrying surface;
an array of chips located at chip sites on the chip carrying surface of the substrate;
a hat cooperating with the substrate to form an enclosed space for the chips, said hat comprising supply means for supplying a liquid coolant;
pistons located in the hat above the chip sites, each of the pistons having a bore, therethrough, connected to carry a liquid coolant from the supply means to one of the chips, and each of the pistons further having lower face, the lower face having a radially symmetrical shape; and
spacer means located on the lower face, for contacting an upper surface of the one of the chips for spacing the lower face from the upper surface, the lower face and the upper surface being disposed to have a gap therebetween that varies as a function of radial distance from the bore.

* * * * *